United States Patent [19]

Seki et al.

[11] Patent Number: 5,099,209
[45] Date of Patent: Mar. 24, 1992

[54] BATTERY VOLTAGE DETECTING DEVICE

[75] Inventors: Yoichi Seki; Hiroyuki Saito; Teruyo Hayakawa, all of Tokyo, Japan

[73] Assignee: Seikosha Co., Ltd., Tokyo, Japan

[21] Appl. No.: 599,327

[22] Filed: Oct. 17, 1990

[30] Foreign Application Priority Data

Oct. 17, 1989 [JP] Japan .................................. 1-269917

[51] Int. Cl.⁵ .............................................. G01N 27/46
[52] U.S. Cl. .................................... 324/428; 324/433; 340/636
[58] Field of Search ................ 324/428, 433; 340/636; 320/48

[56] References Cited

U.S. PATENT DOCUMENTS

| 4,560,937 | 12/1985 | Finger | 324/428 |
| 4,866,389 | 9/1989 | Ryan et al. | 340/636 |

FOREIGN PATENT DOCUMENTS 80069 6/1980 Japan .................................. 324/428

Primary Examiner—Kenneth A. Wieder
Assistant Examiner—Maura K. Regan
Attorney, Agent, or Firm—Jordan and Hamburg

[57] ABSTRACT

A battery voltage detecting device has a circuit for separately detecting the time it takes for a capacitor to be charged to a second reference voltage, in response to the application of a battery voltage and a first reference voltage to the capacitor. A calculating circuit determines the battery voltage from the charging times of the capacitor and the values of the reference voltages.

6 Claims, 3 Drawing Sheets

FIG. 2

| Vbt (Volt) | A (= Tbs/Tbt) |
|---|---|
| 1.90 | 0.229 |
| 1.95 | 0.243 |
| 2.00 | 0.257 |
| 2.05 | 0.271 |

FIG. 3

| Address | Data (Am, Vm) |
|---|---|
| 0 | 0.229 |
| 1 | 0.243 |
| 2 | 0.257 |
| 3 | 0.271 |
| 10 | 1.90 |
| 11 | 1.95 |
| 12 | 2.00 |
| 13 | 2.05 |

BATTERY VOLTAGE DETECTING DEVICE

FIELD OF THE INVENTION

The present invention relates to a battery voltage detecting device.

BACKGROUND OF THE INVENTION

Conventionally, the terminal voltage of a battery has been detected by comparing it with a reference voltage.

The above detecting method fails to accurately detect the terminal voltage of the battery, however, due to the fact that the terminal voltage fluctuates when the load is alternatingly driven.

Further, it has also been difficult to detect the absolute value of the terminal voltage.

SUMMARY OF THE INVENTION

An object of the present invention is to provide a battery voltage detecting device which is capable of accurately detecting the terminal voltage of a battery even when the load is alternatingly driven.

Another object of the present invention is to provide a battery voltage detecting device capable of detecting the absolute value of the terminal voltage of a battery.

According to the present invention, a reference voltage section for generating a reference voltage is connected to an integration circuit; the length of a time "Tbs" elapsed from that connection to the coincidence of the out-put of the integrating circuit with a predetermined voltage "Vrf" and the length of a time "Tbt" elapsed from the connection of a battery with the integration circuit to the coincidence of the output of the integration circuit with the predetermined voltage "Vrf" are measured; and the terminal voltage of the battery is calculated from the times "Tbs" and "Tbt", for example, from the ratio between these two times.

BRIEF DESCRIPTION OF THE DRAWINGS

One embodiment of the present invention will now be described with reference to the accompanying drawings, wherein:

FIG. 2 is a table showing the relationships between the terminal voltage "Vbt" and the time ratio of "Tbs/Tbt";

FIG. 3 is a table illustrating the stored contents of a memory circuit; and

DESCRIPTION OF THE PREFERRED EMBODIMENTS

Figure 1:
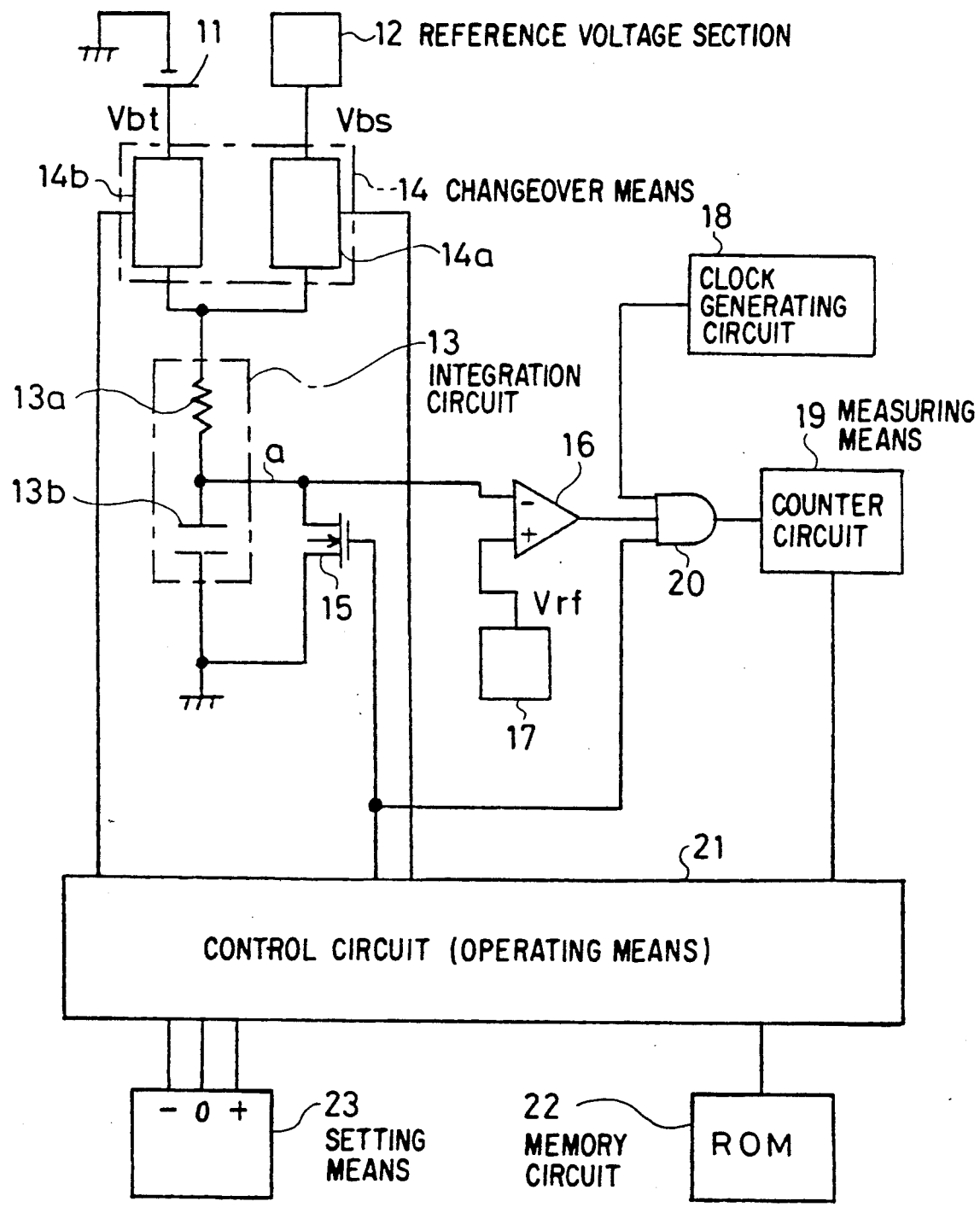
FIG. 1 is an electrical circuit diagram representing one embodiment of the present invention.

Referring now to FIG. 1, reference numeral 11 represents a battery whose terminal voltage is designated by "Vbt".

Reference numeral 12 designates a reference voltage section which generates a reference voltage "Vbs".

Reference numeral 13 designates an integration circuit comprising a resistor 13a and a capacitor 13b.

Reference numeral 14 designates changeover means comprising analog switches 14a and 14b.

Reference numeral 15 designates a transistor which discharges an electric charge stored in the capacitor 13b.

Reference numeral 16 designates a comparator circuit which compares the output voltage of the integration circuit 13 with a reference voltage "Vrf" to be described later.

Reference numeral 17 designates a reference voltage section which generates the reference voltage "Vrf" to be input to the comparator circuit 16.

Reference numeral 18 designates a clock generating circuit which generates a clock pulse.

Reference numeral 19 designates measuring means comprising a counter circuit.

Reference numeral 20 designates an AND gate.

Reference numeral 21 designates a control circuit adapted to perform various kinds of control operations and constitutes operating means for operating the terminal voltage "Vbt" of the battery 11. The control means 21 comprises a microprocessor.

Reference 22 designates a memory circuit in which data is stored for calculating the terminal voltage "Vbt" of the battery 11 and which comprises a ROM (read only memory).

Reference numeral 23 designates setting means which establishes correcting conditions in calculating the terminal voltage of the battery 11.

Power supplied to the above-mentioned elements is provided by the battery 11.

The operation of the embodiment shown in FIG. 1 will now be described.

After the electric charge of the capacitor 13b has been completely discharged through the transistor 15, the transistor 15 is turned OFF by the control circuit 21. During the discharge, the analog switches 14a and 14b are OFF and the counter circuit 19 is in a reset state.

Then the control circuit controls the analog switch 14a to go ON and simultaneously therewith, the counter circuit 19 is released from the reset state. At this time, the output of the comparator circuit 16 is "1" so that the counter circuit 19 counts up in response to each clock signal from the clock generating circuit 18. The capacitor 13b now begins to be charged with an electrical current from the reference voltage section 12. As the charging progresses, the output voltage of the integration circuit 13, that is, the voltage at the point "a" of FIG. 1 increases gradually and when the output voltage of the circuit 13 exceeds the reference voltage "Vrf", the output of the comparator circuit 16 is reversed from "1" to "0". As a result, the gate circuit 20 is closed and the inputting of clocks of the counter circuit 19 is inhibited. At this point of time, the counting of the counter circuit represents the time "Tbs" elapsed from the time of turning ON of the analog switch 14a to the time the output voltage of the integrating circuit 13 exceeds the reference voltage "Vrf". This time "Tbs" is stored in the control circuit 21.

Upon completion of the above operation, the transistor 15 is turned ON and the electric charge stored in the capacitor 13b is discharged. After the capacitor 13b has been completely discharged, the transistor 15 is turned OFF. During the discharge, the analog switches 14a and 14b are OFF and the counter circuit 19 is held in a reset state.

Following the above operation, the analog switch 14b is turned ON and simultaneously therewith, the counter circuit 19 is released from the reset state. At this time, the output of the comparator circuit 16 is "1" so that the counter circuit 19 counts up in response to the clock signal from the clock generating circuit 18. The capacitor 13b now begins to be charged by an electric current from the battery 11 and with the charging of the electric current to the capacitor 13b, the output voltage of the integration circuit 13 increases gradually. When the output voltage of the integration circuit 13 exceeds the reference voltage "Vrf", the output of the comparator circuit 16 is reversed from "1" to "0" and the inputting of clocks to the counter circuit 19 is inhibited. At this time, the counting of the counter circuit 19 represents the time "Tbt" elapsed from the time of turning ON of the analog switch 14b to the time the output voltage of the integrating circuit 13 exceeds the reference voltage "Vrf" and this time "Tbt" is stored in the control circuit 21.

With the above operation, the control circuit 21 will have the time "Tbs" and the time "Tbt" stored therein.

The times "Tbs" and "Tbt" may be expressed by the following equations by using the time constant RC of the integration circuit 13.

$$Tbs = -RC \cdot \ln(1 - Vrf/Vbs) \quad (1)$$

$$Tbt = -RC \cdot \ln(1 - Vrf/Vbt) \quad (2)$$

where ln is a natural logarithm, R is the value of the resistor 13a, C is the value of the capacitor 13b, Vrf is the reference voltage, Vbs is the reference voltage of the reference voltage section 12 and Vbt is the terminal voltage of the battery 11.

The ratio "A" between the above two equations is equal to:

$$\begin{aligned} A &= Tbs/Tbt \\ &= \ln(1 - Vrf/Vbs)/\ln(1 - Vrf/Vbt) \end{aligned} \quad (3)$$

Since the values for "Vrf" and "Vbs" are known and the value for "A" can be obtained by calculating the value for "Tbs/Tbt", the value for "Vbt", i.e., the terminal voltage of the battery 11, can be obtained therefrom.

Further, if the times "Tbs" and "Tbt" are measured a plurality of times to obtain the average times "Tbs'" and "Tbt'" thereof, then the following equation may be established:

$$\begin{aligned} A' &= Tbs'/Tbt' \\ &= \ln(1 - Vrf/Vbs)/\ln(1 - Vrf/Vbt) \end{aligned} \quad (3')$$

Accordingly, the value for "Vbt", i.e., the terminal voltage of the battery 11, may thus be obtained.

Similarly, if the times "Tbs" and "Tbt" are measured a plurality of times and the value for "A" is calculated for every measurement to obtain the average value "A''", the following equation may be established:

$$A'' = \ln(1 - Vrf/Vbs)/\ln(1 - Vrf/Vbt) \quad (3'')$$

Therefore, the value for "Vbt", i.e., the terminal voltage of the battery 11, may be obtained in this manner.

The value of the terminal voltage "Vbt" of the battery 11 may well be obtained by calculating the equation (3), (3') or (3'') by the control circuit 21, but it may also be obtained by the following method.

Figure 4:
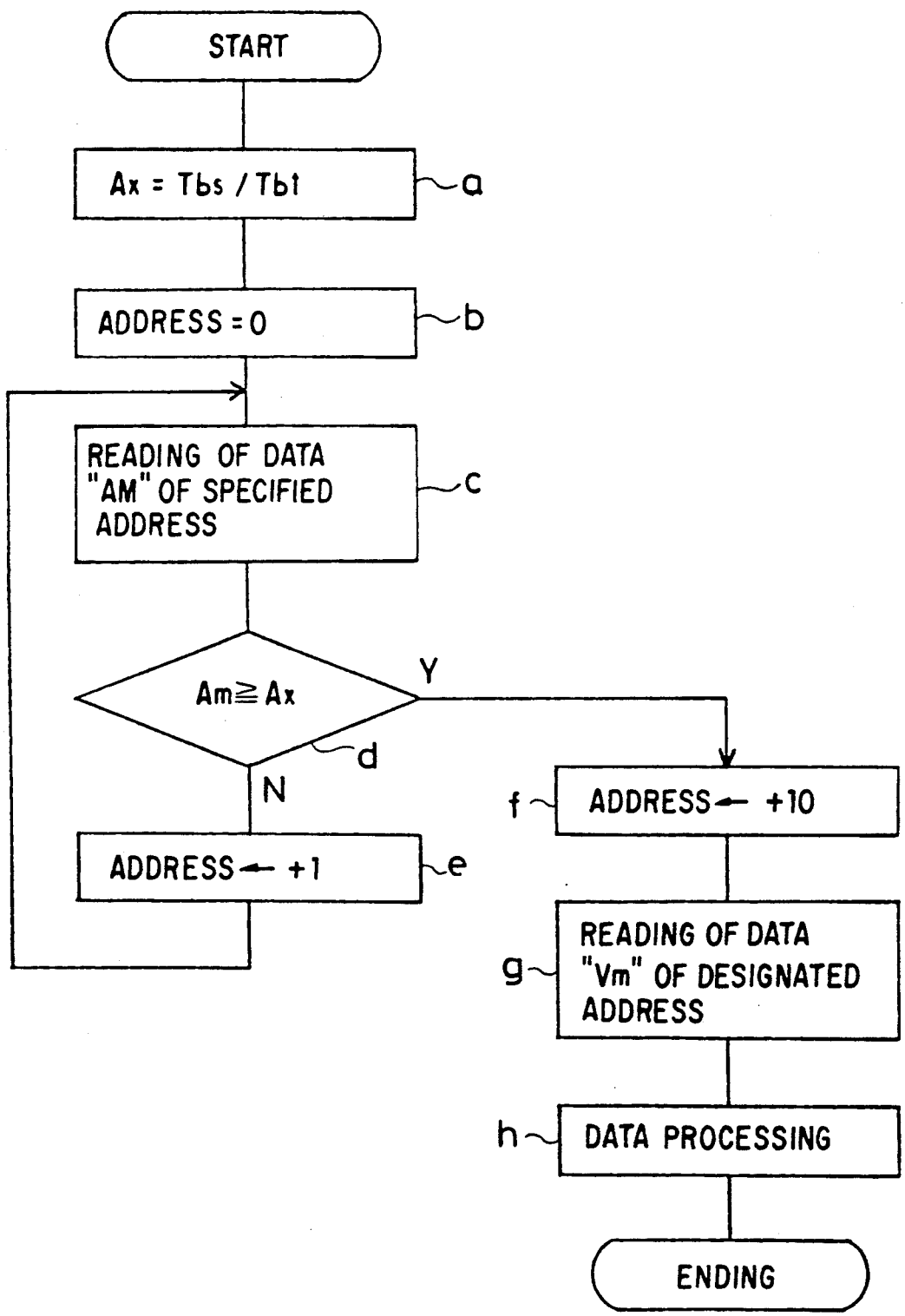
FIG. 4 is a flow chart illustrating the operation of the embodiment of the present invention.

For example, if between the time "Vbt" and the average value "A" was obtained from equation (3) on the assumption that Vrf = 1.5 volts and Vbs = 5.0 volts, the result will be as shown in FIG. 2. Therefore, if the relationship is stored in the memory circuit 22 as shown in FIG. 3, the value for the terminal voltage "Vbt" of the battery 11 may be obtained according to the procedures shown in FIG. 4.

First, (a) calculate the ratio "Ax" of the time "Tbs" with respect to the time "Tbt" by the control circuit 21. Assume, for example, that the value for "Ax" is "0.250"; (b) specify the address "0" of the memory circuit 22; (c) read Data "Am" stored at the specified address "0"; to compare the data "Am" (0.229 in FIG. 3) to the calculated value "Ax" (0.250); and (e) add "+1" to the address value since Am < Ax. The stored data "Am" is then read out in sequence until Am = Ax or Am > Ax is obtained and compared to the calculated value "Ax" (0.250). That is, when the data "Am" (0.257) stored at the address "2" is read out (the above step (c)) and compared to the calculated value "Ax" (0.250) (the above step (d)), it will be found that the relationship of Am > Ax is established. Therefore, the stored data "Am" (0.257) is deemed to be the calculated value "Ax" and the subsequent processing is performed accordingly.

Next, (f) add "+10" to the resultant address value; and (g) read out data "Vm" (2.00 in FIG. 3) stored at the specified address, i.e., "12". As will be clear from FIG. 3, at the address "n" (n = 0, 1, . . .) there is stored the value for the ratio "A" of FIG. 2 and corresponding thereto, there is stored the value for the terminal voltage "Vbt" of FIG. 2 at the address "n+10". Accordingly, the data "2.00" stored at the address "12" is determined to be the terminal voltage "Vbt" of the battery 11. Then, subsequent to these operations (h) perform a data processing step such as converting the above data "2.00" to display data.

Thus, by the above procedures, it is possible to obtain the value for the terminal voltage "Vbt" of the battery 11.

When the circuit of FIG. 1 is mounted on a printed circuit board, an error sometimes takes place in the measurement of the terminal voltage "Vbt" of the battery 11 due to the influence of the wiring resistance and further, sometimes the reference voltage "Vbs" generated from the reference voltage section 12 deviates. In such cases, a proper correcting value may be added to, or deducted from, the calculated value "Ax" thereby obtaining the reference voltage value "Vbs" by the same procedures as described above. For example, the setting means 23 of FIG. 1 may comprise a manual switch such that when the terminal "+" is made active, a correcting value is added while when the terminal "−" is made active, the correcting value is deducted. Alternatively, the setting means 23 may comprise an E²-PROM (electrical erasable—programmable ROM) to store finely graduated correcting values.

According to the present invention, the time "Tbs" elapsed from the connection of the reference voltage section with the integration circuit to the coincidence of the output voltage of the integration circuit to the predetermined voltage "Vrf" and the time "Tbt" elapsed from the connection of the battery to the integration circuit to the coincidence of the output of the integration circuit with the predetermined value "Vrf" are measured and the terminal voltage of the battery is calculated from the measured values for the times "Tbs" and "Tbt". Accordingly, the absolute value for the terminal voltage of the battery can be detected, and the terminal voltage can be detected accurately even when the load is alternatingly driven.

What is claimed is:

1. A battery voltage detecting device comprising:
a reference voltage section for generating a reference voltage;
an input means for receiving a battery voltage;
an integration circuit;
changeover means for selectively connecting said integration circuit between the input means and said reference voltage section;
measuring means for measuring the length of a time "Tbs" elapsed from the connection of the integration circuit with the reference voltage section to the coincidence of the output voltage of the integration circuit with a predetermined value and the length of a time "Tbt" elapsed from the connection of the battery with the integration circuit to the coincidence of the output voltage of the integration circuit with the predetermined value; and
operation means for determining the voltage at the input means from the time "Tbs" and the time "Tbt";
said operation means comprising means for determining the ratio between an average value of "Tbs" obtained by measuring said time "Tbs" a plurality of times and an average value of "Tbt" obtained by measuring said time "Tbt" a plurality of times and then calculating the voltage at said input means from said ratio.

2. A battery voltage detecting device comprising:
input means for receiving a battery voltage;
means for providing first and second reference voltages;
integrating means for providing an output voltage that comprises an integration of an input voltage applied thereto;
control means for selectively connecting said input means and first reference voltage to said integration circuit; and
means for determining first and second times for the output of said integrating means to become equal to said second reference voltage, in response to the connection of said input means and first reference voltage thereto, respectively;
said control means comprising means for calculating the voltage at said input means from said first and second time and first and second reference voltages;
said calculating means comprising means for calculating the voltage at said input means form the relationship:

$$\frac{Tbs}{Tbt} = \frac{\ln(1 - Vrf/Vbs)}{\ln(1 - Vrf/Vbt)}$$

were Tbs and Tbt are said second and first times respectively, Vbs and Vrf are said first and second reference voltages respectively, and Vbt is the voltage at said input means.

3. A battery voltage detecting device comprising:
a reference voltage section for generating a reference voltage;
an input means for receiving a battery voltage;
an integration circuit;
changeover means for selectively connecting said integration circuit between the input means and said reference voltage section;
measuring means for measuring the length of a time "Tbs" elapsed from the connection of the integration circuit with the reference voltage section to the coincidence of the output voltage of the integration circuit with a predetermined value and the length of a time "Tbt" elapsed from the connection of the battery with the integration circuit to the coincidence of the output voltage of the integration circuit with the predetermined value; and
operation means for determining the voltage at the input means form the time "Tbs" and "Tbt", said operation means having a storing means for storing predetermined values corresponding to the voltage at the input means together with predetermined values corresponding to values obtained from the time "Tbs" and the time "Tbt".

4. The battery voltage detecting device of claim 10 wherein said integration circuit comprises a capacitor serially coupled to a charging resistor, and said operation means comprises means for discharging said capacitor before measuring said output voltage with said measuring means, said changeover means connecting said integration means to charge said capacitor during measurement of "Tbt" and "Tbs".

5. A battery voltage detecting device comprising:
an input means for receiving a battery voltage;
means for providing first and second reference voltages;
integrating means for providing an output voltage that comprises an integration of an input voltage applied thereto;
control means for selectively connecting said input means and first reference voltage to said integrating circuit; and
means for determining first and second times for the output of said integrating means to become equal to said second reference voltage, in response to the connection of said input means and first reference voltage thereto, respectively;
said control means comprising means for determining the voltage at said input means form said first and second times and first and second reference voltages;
said means for determining the voltage at sad input means having a storing means for storing predetermined values corresponding to the voltage at said input means together with predetermined values corresponding to values obtained from said first and second times.

6. The battery voltage detecting device of claim 5 wherein said integrating means comprises a capacitor serially coupled to a charging resistor, and said control means, comprises means for discharging said capacitor before measuring said output voltage with said measuring means, said control comprising means connecting said integrating means to charge said capacitor during measurement of said first and second times.

* * * * *